United States Patent [19]
Tanis et al.

[11] Patent Number: 5,258,720
[45] Date of Patent: Nov. 2, 1993

[54] DIGITAL SAMPLE AND HOLD PHASE DETECTOR

[75] Inventors: William J. Tanis, Wayne; Ning H. Lu, Parsippany; Alan N. Schenberg, Kinnelon, all of N.J.

[73] Assignee: ITT Corporation, New York, N.Y.

[21] Appl. No.: 585,651

[22] Filed: Mar. 2, 1984

[51] Int. Cl.$^5$ .............................. H03D 13/00
[52] U.S. Cl. ..................... 328/133; 307/516; 331/18; 375/120
[58] Field of Search ............ 307/516, 526; 324/78 D, 324/83 D; 328/134, 133; 331/18; 375/120

[56] References Cited

U.S. PATENT DOCUMENTS

| | | | |
|---|---|---|---|
| 3,753,141 | 8/1973 | Van Elk et al. | 331/18 X |
| 3,789,308 | 1/1974 | Lowdenslager | 328/155 |
| 3,893,040 | 7/1975 | Harp | 331/18 X |
| 4,103,290 | 7/1978 | Sekiguchi | 324/78 D |
| 4,569,078 | 2/1986 | Zuk | 328/134 X |

FOREIGN PATENT DOCUMENTS 2112236 7/1983 United Kingdom .

Primary Examiner—T. H. Tubbesing
Attorney, Agent, or Firm—Thomas N. Twomey; Patrick M. Hogan

[57] ABSTRACT

The digital sample and hold phase detector to compare the phase relationship between input pulses and a high frequency reference clock comprises a digital counter arrangement coupled to count the high frequency reference clock to produce a digital ramp signal and a digital sampling arrangement coupled to at least the input pulses and an output of the counter arrangement to enable the input pulses to sample the digital ramp signal and produce a digital phase difference signal.

10 Claims, 2 Drawing Sheets

DIGITAL SAMPLE AND HOLD PHASE DETECTOR

BACKGROUND OF THE INVENTION

The present invention relates to sample and hold phase detectors and more particularly to digital sample and hold phase detectors.

Known sample and hold phase detectors used in phase locked loops and phase measuring applications are analog in nature. FIG. 1 shows an example of a prior art analog sample and hold phase detector employed in a phase-locked loop. The analog sample and hold phase detector 1 includes an analog ramp generator 2 responsive to the reference frequency to produce an analog ramp having a period equal to that of the reference frequency. The voltage controlled oscillator 3 produces an RF (radio frequency) output which is divided by N in a frequency divider 4. Under phase locked conditions, the output period of the divider 4 is equal to that of analog ramp produced at the output of generator 2. The output of divider 4 is formed into a narrow pulse which samples the voltage level of the analog ramp by means of, for instance, a semi-conductor switch which is shown schematically as a mechanical switch 5. The sample voltage is held by a holding capacitor 6 between samples. Under locked conditions, the voltage held in capacitor 6 is proportional to the phase difference between the RF output of oscillator 3 divided by N and the reference frequency. This voltage of capacitor 6 is amplified and integrated in amplifier-integrater 7 and fed back negatively to control the frequency of oscillator 3 to maintain phase lock.

N of divider 4, depending on the application, can be any number including one and fractions. When N is fractional, the phase locked frequency source assembly is often known as a "fractional division" or "fractional-N" frequency synthesizer. The output voltage of the sample and hold phase detector 1 will change somewhat in amplitude, causing a phase measurement error with temperature, with bias voltage variation and with aging. When used in a phase-locked loop, this error will be reflected in a phase change in the RF output of the oscillator 3. In some applications, the phase detector output voltage is used as an indication of phase offset between signal sources. Any detector non-linearities will cause a phase measurement error. The non-linearities are worse at high frequencies where it is difficult to generate a linear ramp. When the analog sample and hold phase detector 1 is used in a fractional division frequency synthesizer, non-linearities of a couple of per cent are capable of producing rather strong FM (frequency modulation) sidebands around the oscillator 3 operating frequency (carrier).

SUMMARY OF THE INVENTION

An object of the present invention is to provide a digital sample and hold phase detector that may be employed in phase locked loops and for phase measurement of the phase offset between two input signals.

A feature of the present invention is the provision of a digital sample and hold phase detector comprising: input pulses to be compared in phase to a high frequency reference clock; digital counter means coupled to the high frequency reference clock for counting thereof to produce a digital ramp signal; and digital sampling means coupled to at least the input pulses and an output of the counter means to enable the input pulses to sample the digital ramp signal and produce a digital phase difference signal.

BRIEF DESCRIPTION OF THE DRAWING

Above-mentioned and other features and objects of this invention will become more apparent by reference to the following description taken in conjunction with the accompanying drawing, in which.

DESCRIPTION OF THE PREFERRED EMBODIMENTS

A description of the digital sample and hold phase detector of the present application will be described in the environment of the phase locked loop. However, it is to be noted that the digital sample and hold phase detector of the present application may be also employed to provide an indication of the phase offset or phase difference between two input signals.

Figure 2:
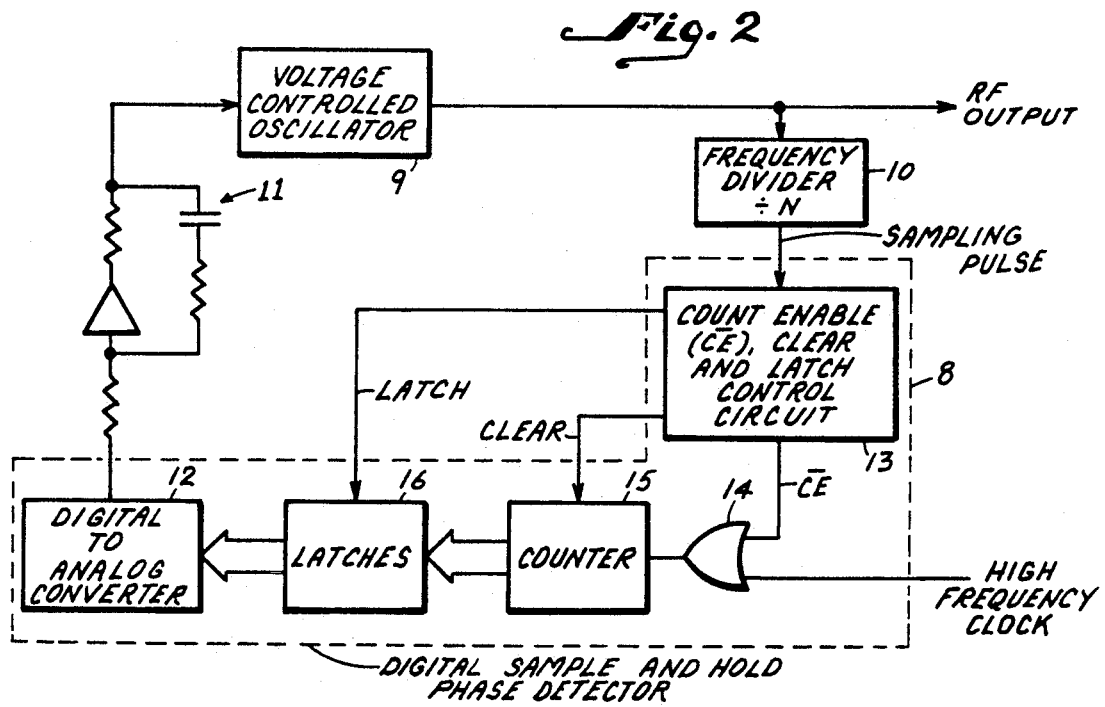
FIG. 2 is a block diagram of a digital sample and hold phase detector in accordance with the principles of the present invention employed in a phase locked loop.

Refer to FIG. 2, the digital sample and hold phase detector 8 is shown in the embodiment of a phase locked loop including the voltage controlled oscillator 9, frequency divider 10 and amplifier-integrater 11 applying the phase error control voltage to the tuning input of the voltage controlled oscillator 9 with the error voltage resulting from the operation of detector 8. All the processing in detector 8 except for the digital to analog converter 12 is done digitally and, therefore, the non-linearity and temperature shortcomings mentioned hereinabove with respect to the analog sample and hold phase detector is nearly non-existent.

Figure 1:
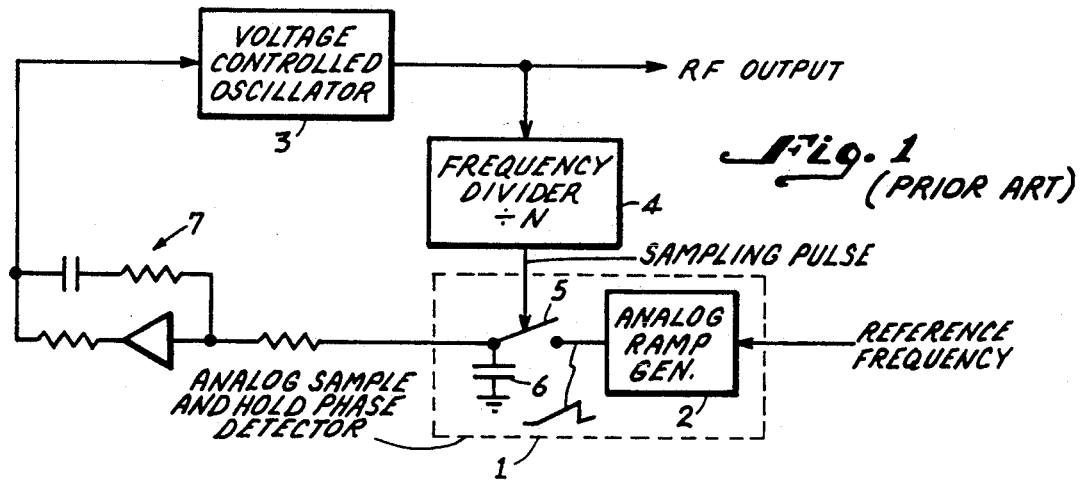
FIG. 1 is a block diagram of a prior art analog sample and hold phase detector employed in a phased locked loop as described hereinabove under the heading "Background of the Invention"

As mentioned hereinabove with respect to FIG. 1 the output of frequency divider 10 provides a sampling pulse which is operated upon by the Count Enable, Clear and Latch Control circuit 13 to produce a not Count Enable Signal ($\overline{CE}$), a CLEAR signal and a LATCH signal. The high frequency reference or clock is passed through OR gate 14 when the $\overline{CE}$ Signal is low or logic "0" so as to provide the high frequency reference clock at the count input of counter 15. The incrementing or decrementing binary or digital output word of counter 15 forms a digital reference "ramp" which is "sampled" by the sampling pulse at the output of divider 10 or a pulse derived therefrom. The sampling takes place in latches 16 under the control of the LATCH signal. The "sampled" words stored in latch 16 are converted to an analog voltage by the digital to analog converter 12.

Figure 3:
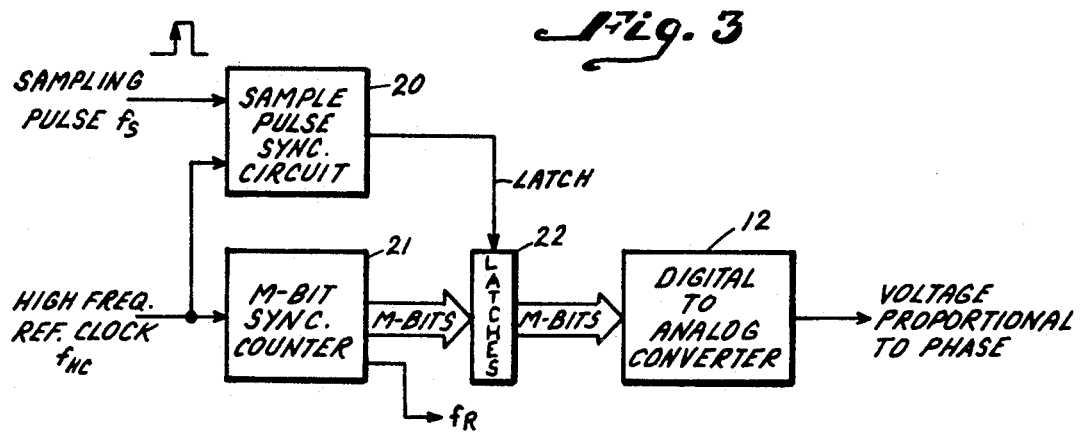
FIG. 3 is a block diagram of one embodiment of a digital sample and hold phase detector in accordance with the principles of the present invention.

Referring to FIG. 3, there is illustrated therein one embodiment of the digital sample and hold phase detector 8 of FIG. 2. The sampling pulse from divider 10 of FIG. 2 is synchronized with the high frequency reference clock in circuit 20 and the high frequency reference clock is counted in the M-bit synchronous counter 21. The synchronized sampling pulse at the output of circuit 20 is then used to latch the accumulated contents of counter 21 in latches 22 until the next sampling pulse arrives, at which time the latches 22 are updated. The data stored in latches 22 would then be coupled to converter 12 of FIG. 2 and is a digital word which is proportional to the time delay (or phase difference) between reset of counter 21 and the time the sampling pusle appears.

The high frequency reference clock drives the synchronous counter 21 which increments or decrements its binary output data word after each clock pulse. Counter 21 reaches terminal count and resets at the rate of $f_R = f_{HC}/2^M$, where $f_{HC}$ is a frequency of the high frequency reference clock and M is the number of output bits from counter 21. The output word of counter 21 is often referred to as the reference frequency $f_R$ or reference "ramp". Under normal steady state conditions the frequency of the sample pulse train $F_s$ equals the reference frequency $f_R$. The phase detector of FIG. 3 has a full $2\pi$ radian dynamic range with an output resolution of $2\pi/2^M$ radians of phase.

Figure 4:
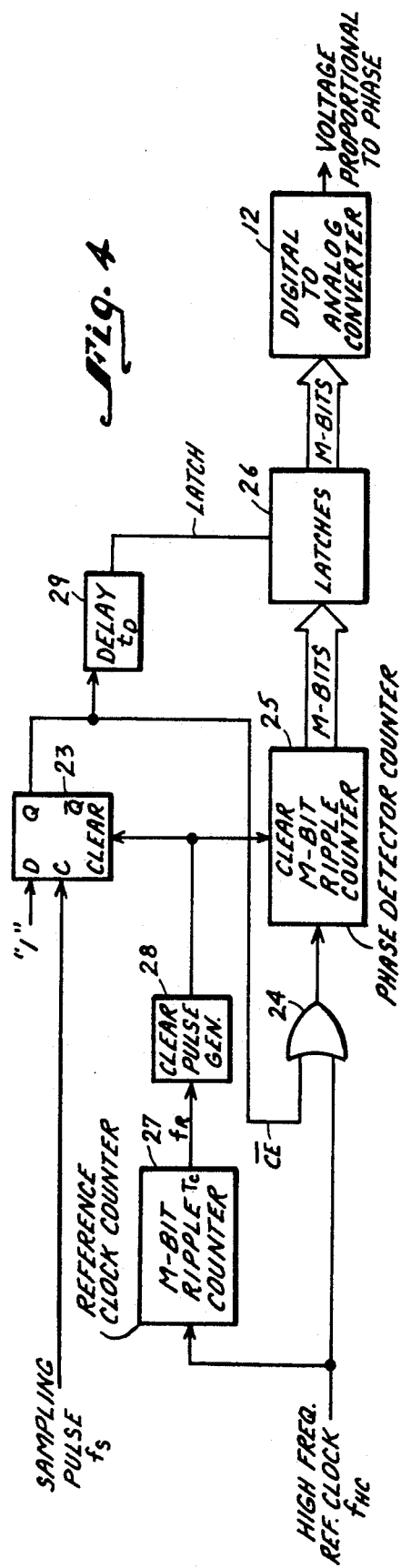
FIG. 4 is a block diagram of a second embodiment of a digital sample and hold phase detector in accordance with the principles of the present invention.

Referring to FIG. 4, there is illustrated therein a block diagram of an alternative arrangement for phase detector 8 employing ripple counters instead of synchronous counters. Ripple counters can work at gigahertz rates. In this configuration, after the sampling pulse arrives and triggers the flip flop 23, the Q output therefrom is coupled to OR gate 24 to inhibit the high frequency reference clock from clocking the phase detector counter 25.

The Q output of flip flop 23 is normally low or logic "0" and when the sampling pulse clocks flip flop 23 the Q output becomes high or logic "one". Thus, when one input to OR gate 24 is high upon the occurrence of the sampling pulse the high frequency reference clock is blocked by gate 24 and cannot clock the counter 25. Time is allowed for the ripple counter data outputs to stablize after which the data is latched in latches 26. A second M-bit ripple counter 27 produces a reference frequency clock $f_R$ which clears the phase detector counter 25 and flip flop 23 and restarts the counter cycle via the flip flop 23 and gate 24. The clear pulse for clearing flip flops 23 and counter 25 is produced in clear pulse generator 28. Delay circuit 29 delays the sampling pulse by a time $t_D$ until ripple counter 25 outputs have time to stabilize.

As the frequency increases, the time ($t_D$) it takes for the ripple counter 25 to stabilize becomes a significant portion of reference frequency period and the dynamic range of the phase detector becomes limited. The dynamic range can be defined as $R = [(T_R - t_D)/T_R]$, $2\pi$ radians, where $T_R = 1/f_R$.

Figure 5:
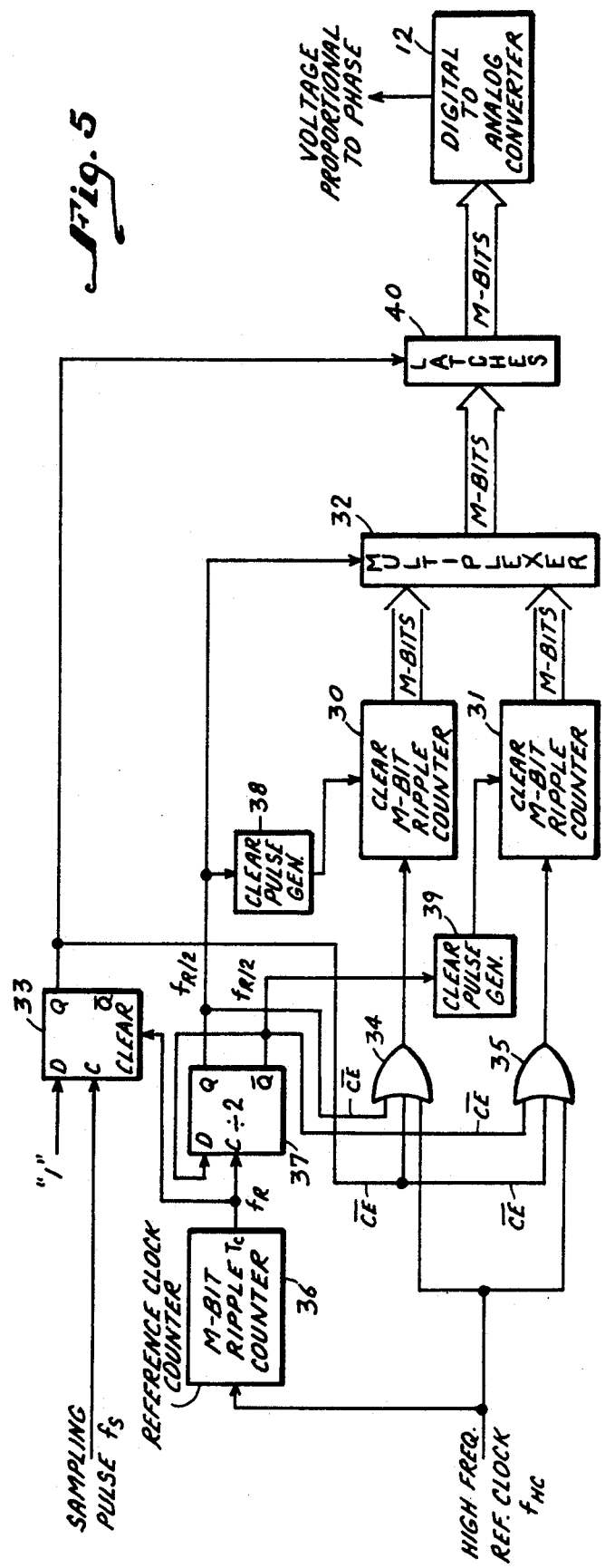
FIG. 5 is a block diagram of a third embodiment of a digital sample and hold phase detector in accordance with the principles of the present invention.

If the range limitation is unacceptable the arrangement of FIG. 5 may be employed wherein two ripple counters 30 and 31 are employed as the phase detector counters with the outputs of these two counters 30 and 31 being multiplexed in multiplexer 32. As in FIG. 4 the sampling pulse is coupled to flip flop 33 whose Q output is coupled to OR gates 34 and 35 for controlling the input of the high frequency reference clock to ripple counters 30 and 31. Ripple counter 36 provides the reference clock $f_R$ from the high frequency reference clock and is divided by two in flip flop 37 with the Q output of flip flop 37 being coupled to OR gate 34 and the $\overline{Q}$ output of flip flop 37 being coupled to OR gate 35.

The inputs from flip flop 37 to gates 34 and 35 control counter 30 to count at one time while counter 31 is settling and vice versa. The output of counter 36 controls the clearing of flip flop 33 and clear pulse generators 38 and 39 responsive to the Q and $\overline{Q}$ outputs of flip flop 37 control the clearing of counters of 30 and 31, respectively. The Q output of flip flop 37 controls multiplexer 32 and the Q output of flip flop 33 controls the latches 40 whose output are coupled to converter 12 of FIG. 2.

While we have described above the principles of our invention in connection with specific apparatus, it is to be clearly understood that this description is made only by way of example and not as a limitation to the scope of our invention as set forth in the objects thereof and in the accompanying claims.

We claim:

1. A digital sample and hold phase detector comprising:
    a first input to be compared in phase to a high frequency reference clock input;
    digital counter means coupled to said high frequency reference clock input for counting thereof to produce a digital ramp signal; and
    digital sampling means coupled to at least said first input and an output of said counter means to enable said first input to sample said digital ramp signal and produce a digital phase difference signal; said counter means including
    an M-bit synchronous counter coupled to said high frequency reference clock input to produce said ramp signal, wherein M is an integer; and said sampling means including
    a synchronizing circuit coupled to said first input and said high frequency reference clock input to synchronize said first input to said high frequency reference clock input; and
    latches coupled to said synchronizing circuit and said counter to sample said ramp signal with said synchronized input.

2. The digital sample and hold phase detector according to claim 1 further comprising:
    a digital-to-analog converter coupled to said sampling means to convert said digital phase differences signal into an analog phase difference signal.

3. A digital sample and hold phase detector comprising:
    a first input to be compared in phase to a high frequency reference clock input;
    digital counter means coupled to said high frequency reference clock input for counting thereof to produce a digital ramp signal; and
    digital sampling means coupled to at least said first input and an output of said counter means to enable said first input to sample said digital ramp signal and produce a digital phase difference signal;
    said counter means including
    a first M-bit ripple counter to produce said digital ramp signal, where M is an integer,
    a gate having an output coupled to a count input of said first counter, a first gate input coupled to said high frequency reference clock input and a second gate input having a count enable signal coupled thereto to control passage of said high frequency reference clock input to said first counter; and
    said sampling means including
    a D-type flip flop coupled to said first input to produce said count enable signal, a second M-bit ripple counter coupled to said high frequency reference clock input, a clear pulse generator coupled to said second counter, said first counter and said flip flop to produce a clear pulse for clearing said first counter and said flip flop, a delay means coupled to said flip flop responding to said count enable signal to produce a sampling pulse delayed a predetermined amount related to settling time of said first counter, and latches coupled to said first counter and said delay means to enable sampling of said digital ramp signal by said sampling pulse to produce said digital phase difference signal.

4. The digital sample and hold phase detector according to claim 3 further comprising:

a digital-to-analog converter coupled to said sampling means to convert said digital phase differences signal into an analog phase difference signal.

5. A digital sample and hold phase detector comprising:

a first input to be compared in phase to a high frequency reference clock input;

digital counter means coupled to said high frequency reference clock input for counting thereof to produce a digital ramp signal; and digital sampling means coupled to at least said first input and an output of said counter means to enable said first input to sample said digital ramp signal and produce a digital phase difference signal; said counter means including a first M-bit ripple counter to produce said digital ramp signal during first time periods, where M is an integer, a second M-bit ripple counter to produce said digital ramp signal during second time periods each disposed between different adjacent ones of said first time periods, a first gate having an output coupled to said first counter, a first gate input coupled to said high frequency reference clock input, a second gate input having a first count enable signal coupled thereto and a third gate input having a second count enable signal coupled thereto, said first and second count enable signals controlling passage of said high frequency reference clock to said first counter, and a second gate having an output coupled to said second counter, a first gate input coupled to said high frequency reference clock input, a second gate input having said first count enable signal coupled thereto and a third gate input having a third count enable signal coupled thereto, said first and third count enable signals controlling passage of said high frequency reference clock to said second counter; and said sample means including a D-type flip flop coupled to said first input to produce said first count enable signal, a third M-bit ripple counter coupled to said high frequency reference clock input and said flip flop to produce a reference signal to clear said flip flop, a divide-by-two circuit coupled to said first and second gates and said third counter to divide said reference signal in half and to provide at a non-inverting output one of said second and third count enable signals and at an inverting output the other of said second and third count enable signals, a first clear pulse generator coupled between said non-inverting output of said divide-by-two circuit and said first counter to clear said first counter, a second clear pulse generator coupled between said inverting output of said divide-by-two circuit and said second counter to clear said second counter, multiplexing means coupled to said first and second counters and said divide-by-two circuit to provide said digital ramp signal in each of said first and second time periods at an output thereof, and latches coupled to said output of said multiplexing means and said flip flop to enable sampling of said digital ramp signal by said first count enable signal to produce said digital phase difference signal.

6. The digital sample and hold phase detector according to claim 5 further comprising:

a digital-to-analog converter coupled to said sampling means to convert said digital phase differences signal into an analog phase difference signal.

7. A digital sample and hold phase detector comprising:

a first input to be compared in phase to a high frequency reference clock input;

digital counter means coupled to said high frequency reference clock input for counting thereof to produce a digital ramp signal; and digital sampling means coupled to at least said first input and an output of said counter means to enable said first input to sample said digital ramp signal and produce a digital phase difference signal;

said counter means including a first M-bit ripple counter to produce said digital ramp signal, where M is an integer, a gate having an output coupled to a count input of said first counter, a first gate input coupled to said high frequency reference clock input and a second gate input having a count enable signal coupled thereto to control passage of said high frequency reference clock input to said first counter; and said sampling means including a D-type flip flop coupled to said first input to produce said count enable signal, a second M-bit ripple counter coupled to said high frequency reference clock input, a delay means coupled to said flip flop responding to said count enable signal to produce a sampling pulse delayed a predetermined amount related to settling time of said first counter, and latches coupled to said first counter and said delay means to enable sampling of said digital ramp signal by said sampling pulse to produce said digital phase difference signal.

8. The digital sample and hold phase detector according to claim 7 further comprising:

a digital-to-analog converter coupled to said sampling means to convert said digital phase differences signal into an analog phase difference signal.

9. A digital sample and hold phase detector comprising:

a first input to be compared in phase to a high frequency reference clock input;

digital counter means coupled to said high frequency reference clock input for counting thereof to produce a digital ramp signal; and digital sampling means coupled to at least said first input and an output of said counter means to enable said first input to sample said digital ramp signal and produce a digital phase difference signal;

said counter means including
a first M-bit ripple counter to produce said digital ramp signal during first time periods, where M is an integer,
a second M-bit ripple counter to produce said digital ramp signal during second time periods each disposed between different adjacent ones of said first time periods,
a first gate having an output coupled to said first counter, a first gate input coupled to said high frequency reference clock input, a second gate input having a first count enable signal coupled thereto and a third gate input having a second count enable signal coupled thereto, said first and second count enable signals controlling passage of said high frequency reference clock input to said first counter, and
a second gate having an output coupled to said second counter, a first gate input coupled to said high frequency reference clock input, a second gate input having said first count enable signal coupled thereto and a third gate input having a third count enable signal coupled thereto, said first and third count enable signals controlling passage of said high frequency reference clock input to said second counter; and said sampling means including
a D-type flip flop coupled to said first input to produce said first count enable signal,
a third M-bit ripple counter coupled to said high frequency reference clock input and said flip flop to produce a reference signal to clear said flip flop,
a divide-by-two circuit coupled to said first and second gates and said third counter to divide said reference signal in half and to provide at a non-inverting output one of said second and third count enable signals and at an inverting output the other of said second and third count enable signals,
multiplexing means coupled to said first and second counters and said divide-by-two circuit to provide said digital ramp signal in each of said first and second time periods at an output thereof, and
latches coupled to said output of said multiplexing means and said flip flop to enable sampling of said digital ramp signal by said first count enable signal to produce said digital phase difference signal.

10. The digital phase sample and hold detector according to claim 9 further comprising:
a digital-to-analog converter coupled to said sampling means to convert said digital phase differences signal into an analog phase difference signal.

* * * * *